United States Patent [19]

Jackson et al.

[11] Patent Number: 4,752,729
[45] Date of Patent: Jun. 21, 1988

[54] TEST CIRCUIT FOR VSLI INTEGRATED CIRCUITS

[75] Inventors: Keith Jackson, Puyallup, Wash.; Jeffrey A. Niehaus, Dallas, Tex.

[73] Assignee: Texas Instruments Incorporated, Dallas, Tex.

[21] Appl. No.: 880,768

[22] Filed: Jul. 1, 1986

[51] Int. Cl.4 ............................................. G01R 31/02
[52] U.S. Cl. .................................... 324/73 R; 371/15
[58] Field of Search ............... 307/440, 445, 473, 474; 324/73 R, 73 AT, 73 PC; 371/15, 16, 18, 25, 67, 68

[56] References Cited

U.S. PATENT DOCUMENTS 4,503,387  3/1985  Rutledge et al. .................. 324/73 R

FOREIGN PATENT DOCUMENTS

| 0070754 | 5/1980 | Japan | 324/73 R |
| 0123044 | 9/1981 | Japan | 371/15 |
| 0045943 | 3/1982 | Japan | 324/73 R |
| 0100437 | 6/1983 | Japan | 324/73 R |
| 0211672 | 12/1983 | Japan | 324/73 R |
| 0188572 | 10/1984 | Japan | 324/73 R |
| 0131480 | 7/1985 | Japan | 324/73 R |
| 2085171 | 4/1982 | United Kingdom | 324/73 R |

OTHER PUBLICATIONS

"Four-State Driver for Memory Testing", by Abodeer, *IBM Tech. Disc. Bull.*, vol. 23, No. 8, 1/81, pp. 3605-3607.

"Diagnostic Testing and I/O Identification", by Dwire et al., *IBM Tech. Disc. Bull.*, vol. 22, No. 11, 4/80, pp. 4801-4802.

*Primary Examiner*—Reinhard J. Eisenzopf
*Assistant Examiner*—W. Burns
*Attorney, Agent, or Firm*—Gary C. Honeycutt; Melvin Sharp; Rhys Merrett

[57] ABSTRACT

A test circuit for a VLSI integrated circuit includes interface test circuits (20) which are disposed between a logic circuit (16) an output terminal (14). The interface circuits (20) are each operable to provide a transparent interface between logic circuit (16) and output terminals (14) or force a high logic state on the output, a low logic state on the output or a floating state. A test code circuit (22) is operable to receive two logic signals from pins (24) and (26) external to the IC and determine the state of the test interface circuit (20) such that all test interface circuits (20) operate simultaneously in the same mode.

15 Claims, 1 Drawing Sheet

TEST CIRCUIT FOR VSLI INTEGRATED CIRCUITS

TECHNICAL FIELD OF THE INVENTION

The present invention pertains in general to test circuits for a VLSI integrated circuit and, more particular, to a test circuit for testing DC parametrics at internal nodes in the integrated circuit.

BACKGROUND OF THE INVENTION

Very large scale integrated circuits (VLSI) have seen increasing use of built-in test circuits that are utilized to either self-test the circuit or enhance board testing of the circuit. These circuits have emerged as a solution to the costs and complexity of testing these large circuit arrays, some of which can exceed 20,000 individual gates. As the densities increase, the need for more versatile test circuits also increases.

Testing of a VLSI array is done at a number of levels depending upon the complexity and the desired results. Lab testing is one stage of testing that requires both AC and DC parameter verification and a provision for debugging of the circuit. Lab testing usual requires that each input of the device be controlled for each test which can present a problem due the number of wires and probes and associated equipment required. In another type of testing, automatic testing, a large percentage of time is involved in DC parametric measurements which requires substantial "setting-up time." This is due to the internal logic which must be accounted for in determining the desired state on the outputs. It may take several sequences of input data and measurement cycles to test all the outputs in the automatic testing scheme.

Life testing is another type of testing which requires exercising the device in a controlled environment such as an oven. In addition to the limitations in the above testing, in lifetesting it is necessary to exercise the device under maximum power consumption to ensure that the device is properly stressed. Power consumption of large pin count devices is highly dependent on the state of the output. Depending upon the type of test circuit implemented in the device, it may be difficult if not impossible to place multiple bus devices in the worst-case power condition due to lack of total input control.

Another advantage sought through built-in test circuits is fault isolation at the board level. This is complicated by the number of devices that exist on a single bus. Typically, devices are either removed or traces cut until the fault is found. This technique can be tedious if the fault results only from a certain sequence of test inputs which must be repeated each time a change is made to see if the problem was isolated. This usually results in the entire test sequence being repeated until the fault is determined, which may take many iterations. A yet further advantage sought from built-in test circuit is one hundred percent AC and functional testing. This can be complicated when internal flip-flops are present in multiple paths since the prior state of the element must be considered in all test sequences and delay measurements.

Prior testing systems have solved some of the above problems by providing enable pins which place the outputs in a three-state mode. In addition, internal nodes on VLSI devices are functionally tested with such methods as LSSD, Signature analysis and built-in self-testing. However, none of these methods provide for the most time consuming test which is the DC parametric test nor do they provide for bench testing or life testing of the devices.

SUMMARY OF THE INVENTION

The present invention disclosed and claimed herein comprises a test circuit for testing the parameters of an integrated circuit. The integrated circuit is contained within a package having a plurality of pins for interfacing with external circuitry. The integrated circuit includes an active circuit having an input and output and a plurality of internal signal nodes. Mode control circuitry is disposed at each of the nodes for controlling the associated node to operate in either a first, second or third mode. The mode control circuitry is operable in the first mode to force the associated nodes to a first logic state, operable in the second mode to force the associated node to a second logic state and operable in a third mode to interface the input of the associated node to the output thereof to provide a signal path therethrough. Mode control circuitry is provided to controlling the node control circuitry on all of the nodes to simultaneously operate in either the first, second or third mode in response to receiving external control signals. Interface circuitry is provided to interface the mode control circuit with a maximum of two of the IC package pins with the two pins receiving the two external test control signals.

In another embodiment of the present invention, a fourth operating mode is provided for placing the nodes in a floating or high impedance state. The fourth mode is controlled by the mode control circuitry and, when activated, all of the nodes simultaneously are forced to the high impedance state.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
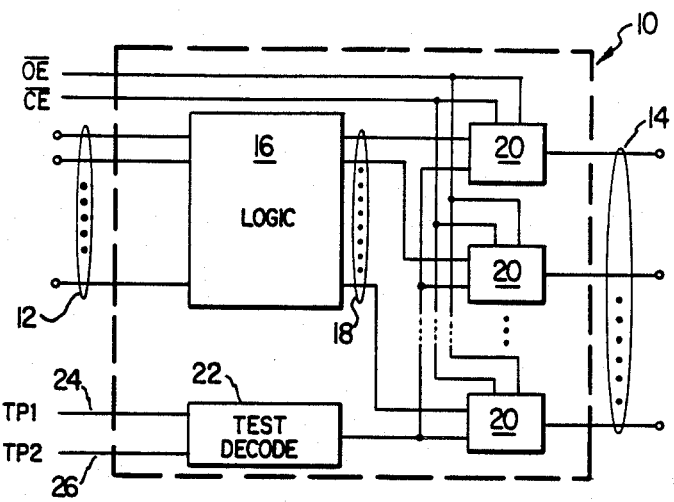
FIG. 1 illustrates a schematic block diagram of the present invention utilized on the output pins of a logic circuit.

Referring now to FIG. 1, there is illustrated a schematic block diagram of an integrated circuit (IC) 10 utilizing the test circuitry of the present invention. The IC 10 has a plurality of input pins 12 and plurality of output pins 14 for allowing interface with external circuitry (not shown). The input pins are interfaced with a logic circuit 16 which can be any type of logic circuit as combinatorial logic. The logic circuit 16 has a plurality of output lines 18 which are each interfaced with a test interface circuit 20. Each of the test interface circuits 20 is interfaced with a separate one of the output terminals of the IC 10.

Each of the test interface circuits 20 is controlled to either force the associated output terminal 14 to a high logic state, a low state or to pass through the logic state on the associated output terminal 18. The test interface circuits 20 are also operable to "float" the output terminal 14 such that it is not at a high logic state, a low logic state nor connected to the associated one of the output terminals 18 from the logic circuit 16. The state of the interface circuits 20 is controlled by a test code circuit 22, test code circuit 22 connected to two pins 24 and 26 of the IC 10. Pin 24 is connected a signal $TP_1$ and pin 26 is connected to a signal $TP_2$. The test interface circuits are also interfaced with an Output Enable signal OE and a Chip Enable signal CE.

The logic state of the signals $TP_1$ and $TP_2$ determines the function of test interface circuits 20. When $TP_1$ and $TP_2$ are both at a low logic state or a logic "0", all the output terminals 14 are forced to a logic "0". When $TP_1$ and $TP_2$ are both at a high logic state or a logic "1" level, the output terminals 14 are interfaced with the output lines 18 of logic circuit 16 and the IC 10 operates in a normal manner. When a logic "0" is applied to $TP_1$ and a logic "1" is applied to $TP_2$, all output terminals 14 are forced to a three-state level and the output terminals are allowed to float with respect to input circuits 20 or any circuitry internal to IC 10. When $TP_1$ is at a logic "1" and $TP_2$ is at a logic "0", all the output terminals 14 are forced to a logic "1" level. Therefore, with the use of only two pins, the output terminals 14 can be placed in one of four states. They can all be forced to a logic high, all be forced to a logic low, allowed to float or allowed to operate in a normal manner. It is important to note that all logic terminals must be in one of these four states and that they are not individually controlled.

Figure 2:
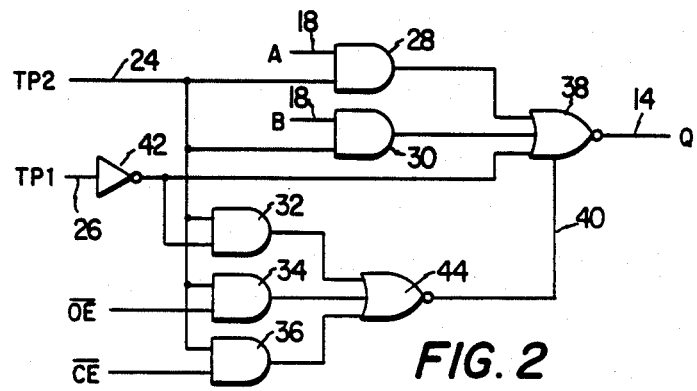
FIG. 2 illustrates a schematic diagram of the decode and output test circuitry for the present invention.

Referring now to FIG. 2, there is illustrated a detailed logic diagram of the test interface circuit 20 and test code circuit 22. The signal $TP_2$ is input to one input of an AND gate 28, one input of an AND gate 30, one input of an AND gate 32, one input of an AND gate 34, and one input of an AND gate 36. The other input AND gate 28 is connected to an "A" input signal and the other input of AND gate 30 is connected to a "B" input signal. The A- and B- inputs are input from the output lines 18 from the logic circuits 16. The outputs of AND gates 28 and 30 are input to a three-input NOR gate 38, NOR gate 38 gated by enable line 40. When line 40 is in a low logic state, NOR gate 38 is enabled and when line 40 is in a high logic state, the output of NOR gate 38 floats. The output of NOR gate 38 comprises one of the output terminals 14.

The $TP_1$ signal line 26 is input through an inverter 42 to one input of three-input NOR gate 38 and one input of AND gate 32. The other input of AND gate 34 is connected to an Output Enable signal OE and the other input of AND gate 36 is connected to the Chip Enable signal CE. Output of AND gates 32-36 are each separately connected to one input of a three-input NOR gate 44, the output of which is connected to the gate line 40 to control NOR gate 38.

In operation, when $TP_1$ is at a logic low, this results in a logic high being input to the NOR gate 38, thus forcing the output on line 14 to a logic low if the gating signal on line 40 is in the "enable" state. When $TP_2$ is at a logic low, this results in a logic low being output from AND gates 28 and 30 and also causes the output of AND gates 32-36 to be at a logic low, resulting in the output of NOR gate 44 being high to "enable" NOR gate 38. When $TP_1$ is at a logic low and $TP_2$ is at a logic high, this causes the output of AND gate 32 to go high, resulting in a logic low on the output of NOR gate 44, thus disabling NOR gate 38. When $TP_1$ is at a logic high, this results in a logic low on the output of AND gate 32 and a logic low on the input to NOR gate 38. If, at the same time that $TP_1$ is at a logic low, $TP_2$ is also at a logic low, this forces the output of AND gates 28 and 30 to a logic low resulting in all of the inputs to NOR gate 38 being at a logic low. This results in a logic high on the output of NOR gate 38 on pins 14, thus forcing all of the outputs of IC 10 to be at a logic high.

When $TP_1$ is at a logic low and $TP_2$ is at a logic high, this forces the output of AND gate 32 to a logic high, thus forcing the output of NOR gate 44 to a logic low to disable NOR gate 38. When NOR gate 38 is disabled, the output thereof "floats"; that is, the output of NOR gate 38 presents a high impedance to line 14, the output of NOR gate 38 therefore being defined as a three-state output that is either at a logic high, a logic low or in a floating state.

When $TP_1$ and $TP_2$ are both at a logic high, the output of AND gate 32 is disabled and the output of AND gates 34 and 36 are determined by the states of the $\overline{OE}$ and $\overline{CE}$ signals, respectively, such that if the $\overline{OE}$ signal is high, the output of NOR gate 44 is low and alternatively, if $\overline{CE}$ is high, the output of NOR gate 44 is also low, thus forcing the output of NOR gate 38 to a floating state.

When the $TP_1$ and $TP_2$ signals are high and the $\overline{OE}$ and $\overline{CE}$ signals are low, the output of NOR gate 38 is controlled by the logic state of the input signals A and B on lines 18. If A and B are both low, this results in a high on the output of NOR gate 38. If either A or B or both are high, this results in a low on the output of NOR gate 38. Therefore, an exclusive OR function is performed. The operation of the circuit FIG. 2 is illustrated in more detail in the Truth Table in Table 1.

TABLE 1*

| A | B | TPI | TP2 | NOE | NCE | Q |
|---|---|-----|-----|-----|-----|---|
| X | X | 0 | 0 | X | X | 0 |
| X | X | 1 | 0 | X | X | 1 |
| X | X | 0 | 1 | X | X | Z |
| X | X | 1 | 1 | 1 | X | Z |
| X | X | 1 | 1 | X | 1 | Z |
| 0 | 0 | 1 | 1 | 0 | 0 | 1 |
| 0 | 1 | 1 | 1 | 0 | 0 | 0 |
| 1 | 0 | 1 | 1 | 0 | 0 | 0 |
| 1 | 1 | 1 | 1 | 0 | 0 | 0 |

*Z = High Impedance State

Referring further to FIGS. 1 and 2, it can be seen that the interface circuit 20 facilitates testing of the IC 10 by allowing an operator to place the IC 10 in a test mode and simultaneously force the outputs to a high logic state, a low logic state or to force the outputs to a floating state. This state is independent of the signals produced by the logic circuit. This is important in that prior to the application of any signal or sequences of signals on the input, the logic state of the output lines 18 from logic circuit 16 is unknown. Without the test circuit of the present invention, it is necessary to set internal gates in the logic circuit 16 to determine the output state on pins, 14.

Testing is performed with the use of two pins, thus minimizing the number of pins that must be dedicated to this particular test. This particular test is very important when considering DC parametrics. For example, in a life test, all of the output drivers can be placed in a logic high state, which state would correspond to the highest current state of the device. For a life test, this may be useful to provide maximum stress on the part. Without the circuit of the present invention, it would be necessary to predetermine the appropriate homing sequence that is necessary to switch the internal logic gates in the logic circuit 16 to raise all of the outputs 18 to a high logic state. However, certain logic circuits do not have such a sequence thus requiring such a separate logic sequence to be designed for test purposes. With the circuit of the present invention, this test is independent of the logic in logic circuit 16.

Figure 3:
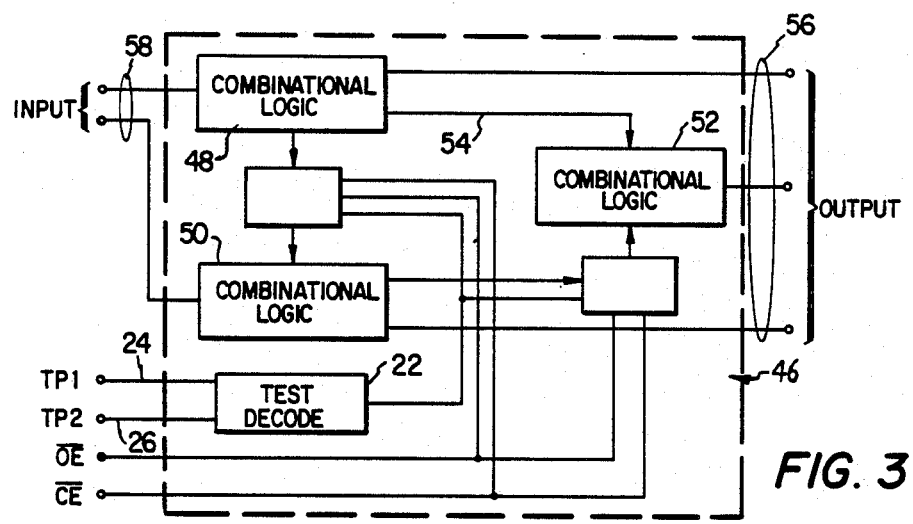
FIG. 3 illustrates a schematic block diagram of the circuitry of the present invention utilized at internal test nodes imbedded within a logic circuit.

Referring now to FIG. 3, there is illustrated a schematic drawing of a alternate embodiment of the present invention utilizing the interface circuits 20 and the test code circuit 22. The interface circuits 20 are utilized in a integrated circuit 46 which is comprised of three combinational logic circuits 48, 50 and 52. Although only three combinational logic circuits are illustrated, it should be understood that numerous combinational circuits can be utilized in any given integrated circuit.

The combinational logic circuit 48 is interfaced directly to combinational logic circuit 52 through line 54 and also to combinational logic circuit 50 through one of the interface circuits 20. Combinational logic circuit 50 is interfaced with combinational logic circuit 52 with all three combinational logic circuits 48-52 having a separate interface with output terminals 56. Input terminals 58 are interfaced only with combinational logic circuits 40 and 50.

The interface circuits 20 that interface between combinational logic circuits 48 and 50 and between combinational logic circuits 50 and 52 are "embedded" test points or test nodes. On some complicated VLSI circuits, there can be a large number of these test points. The function of these embedded points is to force a test node in a system to a predetermined logic state. Past systems have utilized shift registers which allow shifting of a predetermined pattern into the shrft register utilizing a serial string for application to the various test nodes. However, the circuit of the present invention only allow the test nodes to be simultaneously forced to a high logic state, a low logic state or to a floating state. Therefore, with the use of two test pins, and selective location of the test interface circuits 20 between combinational logic blocks a predetermined pattern of all logic high signals or all logic low signals can be input into the selected test nodes. This pattern is predetermined. This does not require input of data but, rather, input of control signals as compared to such systems as LSSD which require the input of predetermined test vectors.

In summary, there has been provided a test interface circuit for disposal at a node to allow the node to be forced to a high logic state, a low logic state or to a floating state. A plurality oil test interface circuits are provided which are all controlled by two test control signals interfaced with two input terminals. The logic state on these two input terminals determines whether the node operates normally, is forced to a high logic state, is forced to a low logic state or forced to a floating state.

Although the preferred embodiment has been described in detail, it should be understood that various changes, substitutions and alterations can be made therein without the parting from the spirit and scope of the invention as defined by the appended claims.

TECHNICAL ADVANTAGES OF THE INVENTION

The present invention provides a technical advantage of forcing a large number of internal signal nodes to a predetermined state or states with a minimum number of input control signals. A minimum number of input control signals allows for the use of minimum number of dedicated input terminals to a device for providing the control function for the internal signal nodes. Additionally, a technical advantage is realized in that all of the internal signal nodes are forced to the same logic state, which may be one of a number of logic states, simultaneously, thus decreasing the amount of time for presetting a large number of signal nodes for such purposes as testing, and presetting homing sequences.

What is claimed is:

1. A test circuit for testing parameters of an integrated circuit having an internal logic function, comprising:
    a package having a plurality of input and output pins for containing the IC, said pins for interfacing external circuitry with the IC;
    an active circuit having an input and an output and a plurality of internal signal nodes each having an input and an output;
    node control means disposed at each of said nodes for controlling said node associated to operate in either a first second or third mode, said first node control means operable in said first mode to force said associated node to a first logic state, operable in said second mode to force said associated node to a second logic state and operable in said third mode to interface the input of said associated node to the output thereof to provide a signal path therethrough;
    mode control means independent of said internal logic function for controlling said node control means on all of said nodes to simultaneously operate in either said first, second or third mode in response to receiving two external test control signals; wherein
    said two external text control signals are binary and said mode control means comprises a decoder for decoding said two test control signals and controlling said node control means in response to a first binary state to operate in said first mode and a second binary state to operate in said second mode and in a third binary state to operate in said third mode;
    means for interfacing said mode control means with a maximum of two of said pins on said package, said maximum of two pins for receiving said two external test control signals.

2. The test circuit of claim 1 wherein said node control means operates in a fourth mode to present a high impedance to the output of said node, said mode control means operable to control said node control means to operate in said fourth mode.

3. The test circuit of claim 1 wherein said two pins interfaced with said interfacing means are dedicated to receive only said external test control signals.

4. The test circuit of claim 1 wherein select ones of said signal nodes are comprised of output nodes for interfacing between said active circuit and associated ones of the output pins.

5. A test circuit in combination with a multipin integrated logic circuit for testing signal nodes therein having inputs and outputs, comprising:
    means for interfacing with each of the signal nodes independently of the logic circuit;
    first means for simultaneously forcing each of the signal nodes in a first test mode to a higher logic state;

second means for simultaneously forcing each of the nodes in a second test mode to a low logic state;

a third means for allowing the signal nodes to operate in a transparent operating mode such that the input to each signal node is passed through to the output of the signal node; and control means for controlling the test circuit to operate in either said first or second test modes, or in said transparent operating mode in response to the input of two external signals at two pins respectively, of said logic circuit from a location exterior to the logic circuit.

6. The test circuit of claim 5 and further comprising:
a package for containing the test circuit and the logic circuit;
a plurality of pins, select ones of said pins interfacing with said logic circuit and select ones of said pins interface with the signal nodes; and
select ones of said pins interfaced with said control means and said two external signals.

7. The test circuit of claim 5 wherein said two pins interfaced with said control means and said two external signals are dedicated pins that function only to interface with said two external signals.

8. The test circuit of claim 5
wherein the third means simultaneously forces each of the signal nodes in a third test mode to a floating logic state by presenting high impedance to the output of each associated node; and
said control means operable to control said third means to operate in said third test mode.

9. The test circuit of claim 5 wherein the signal nodes associated with said first and second means comprise output signal nodes of the logic circuit.

10. The test circuit of claim 5 wherein the two external signals are binary and said control means comprises a decoder for decoding the two external signals to provide a first output in response to a first binary state of the two external control signals for controlling said first means to operate in said first test mode, to provide a second output responsive to a second binary state to control said second means to operate in said second test mode and to provide a third output responsive to a third binary state to control said third means to operate in said normal transparent operating mode.

11. A method for testing internal nodes having inputs and outputs in an integrated circuit, comprising:
providing a predetermined number of interface pins for interfacing with the integrated circuit;
receiving two external test signals in a maximum of two of the interface pins, the external test signals containing coded information;
decoding decoded information in the external test signals and outputting a first test control signal corresponding to a first test mode, a second test control signal corresponding to a second test mode and a third test control signal corresponding to a normal operating mode:
forcing selected ones of the internal nodes simultaneously to a first logic state in response to outputting of said first test control signal;
forcing the select nodes simultaneously to a second logic state opposite the first logic state in response to receiving the second test control signal; and
allowing the selected internal nodes to operate in a normal transparent manner with the input thereof connected to the output thereof in response to output of the third test control signal.

12. The method of claim 10 wherein the pins that are associated with the two external test signals are dedicated to operating with the two external test signals.

13. The method of claim 10 wherein the two external test signals are binary.

14. The method of claim 10 and further comprising decoding the two external signals to output a third test control signal and forcing the select internal nodes to a floating state to present a high impedance on the outputs thereof in response to outputting of the third test control signal.

15. The method of claim 10 wherein the select internal nodes are output nodes for the integrated circuit.

* * * * *